(12) United States Patent
Hosoe et al.

(10) Patent No.: US 7,688,671 B2
(45) Date of Patent: Mar. 30, 2010

(54) SEMICONDUCTOR MEMORY CHIP WITH ON-DIE TERMINATION FUNCTION

(75) Inventors: Yuki Hosoe, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 105 days.

(21) Appl. No.: 11/582,981

(22) Filed: Oct. 19, 2006

(65) Prior Publication Data
US 2007/0103188 A1 May 10, 2007

(30) Foreign Application Priority Data
Oct. 21, 2005 (JP) .............................. 2005-307908

(51) Int. Cl.
*G11C 8/00* (2006.01)
*G11C 5/14* (2006.01)
(52) U.S. Cl. .................. 365/233; 365/229; 365/194
(58) Field of Classification Search .................... 326/30
See application file for complete search history.

(56) References Cited

U.S. PATENT DOCUMENTS

| 6,266,294 | B1 * | 7/2001 | Yada et al. ............. 365/233.14 |
| 6,532,522 | B1 * | 3/2003 | Barth et al. ................. 711/167 |
| 6,754,132 | B2 | 6/2004 | Kyung |
| 7,102,200 | B2 | 9/2006 | Fan et al. |
| 7,170,313 | B2 * | 1/2007 | Shin ............................. 326/30 |
| 7,245,552 | B2 * | 7/2007 | Freebern ................ 365/189.14 |
| 2003/0042573 | A1 | 3/2003 | Fan et al. |
| 2005/0180229 | A1 | 8/2005 | Jin |
| 2007/0126469 | A1 * | 6/2007 | Kim et al. ..................... 326/30 |

FOREIGN PATENT DOCUMENTS

| EP | 1 306 849 A2 | 5/2003 |
| EP | 1308849 A2 | 5/2003 |
| JP | 2003-223784 | 8/2003 |

OTHER PUBLICATIONS

Taiwanese Office Action and Search Report, issued in Taiwanese Patent Application No. TW 095138661 dated on Aug. 14, 2008.

* cited by examiner

*Primary Examiner*—Vibol Tan
*Assistant Examiner*—Matthew C Tabler
(74) *Attorney, Agent, or Firm*—McDermott Will & Emery LLP

(57) ABSTRACT

A semiconductor memory chip with an On-Die Termination (ODT) function is disclosed, which comprises a delay locked loop (DLL) circuit, a synchronous circuit, an asynchronous circuit, a select signal generator, and a selector. The DLL circuit is configured to produce a local clock signal in response to a clock signal when a clock enable (CKE) signal is asserted. The DLL circuit has a predetermined boost time. The select signal generator is configured to assert a select signal in consideration of the predetermined boost time. The selector is configured to select an output of the asynchronous circuit until the select signal is asserted but to select another output of the synchronous circuit after the select signal is asserted.

18 Claims, 6 Drawing Sheets

SEMICONDUCTOR MEMORY CHIP WITH ON-DIE TERMINATION FUNCTION

BACKGROUND OF THE INVENTION

This invention relates to a semiconductor memory chip such as a dynamic random access memory (DRAM) chip and, in particular, to a semiconductor memory chip with On-Die Termination (ODT) function.

A termination circuit is required for good signal integrity at a high frequency operation, as described in U.S. Pat. No. 7,102,200 B2, which is incorporated herein by reference.

As a relevant technique, EP 1 308 849 A2 discloses a memory circuit with an active termination circuit, which is incorporated herein by reference in its entirety. The disclosed circuit comprises a signal terminal, a synchronous input buffer, an asynchronous input buffer and a switching circuit. The synchronous input buffer has an input coupled to the signal terminal. The asynchronous input buffer has another input coupled to the signal terminal. The switching circuit selectively outputs an output of the synchronous input buffer or another output of the asynchronous input buffer in accordance with an operational mode of the memory circuit.

However, according to the disclosure of EP 1 308 849, there might be raised a problem that the synchronous input buffer might malfunction. Hence, there is a need for a circuit that can function with a higher degree of precision.

SUMMARY OF THE INVENTION

According to one aspect of the present invention, a semiconductor memory chip with an On-Die Termination (ODT) function comprises a delay locked loop (DLL) circuit, a synchronous circuit, an asynchronous circuit, a select signal generator, and a selector. The DLL circuit is configured to produce a local clock signal in response to a clock signal when a clock enable (CKE) signal is asserted. The DLL circuit has a predetermined boost time. The select signal generator is configured to assert a select signal in consideration of the predetermined boost time. The selector is configured to select an output of the asynchronous circuit until the select signal is asserted but to select another output of the synchronous circuit after the select signal is asserted.

An appreciation of the objectives of the present invention and a more complete understanding of its structure may be had by studying the following description of the preferred embodiment and by referring to the accompanying drawings.

Figure 1:
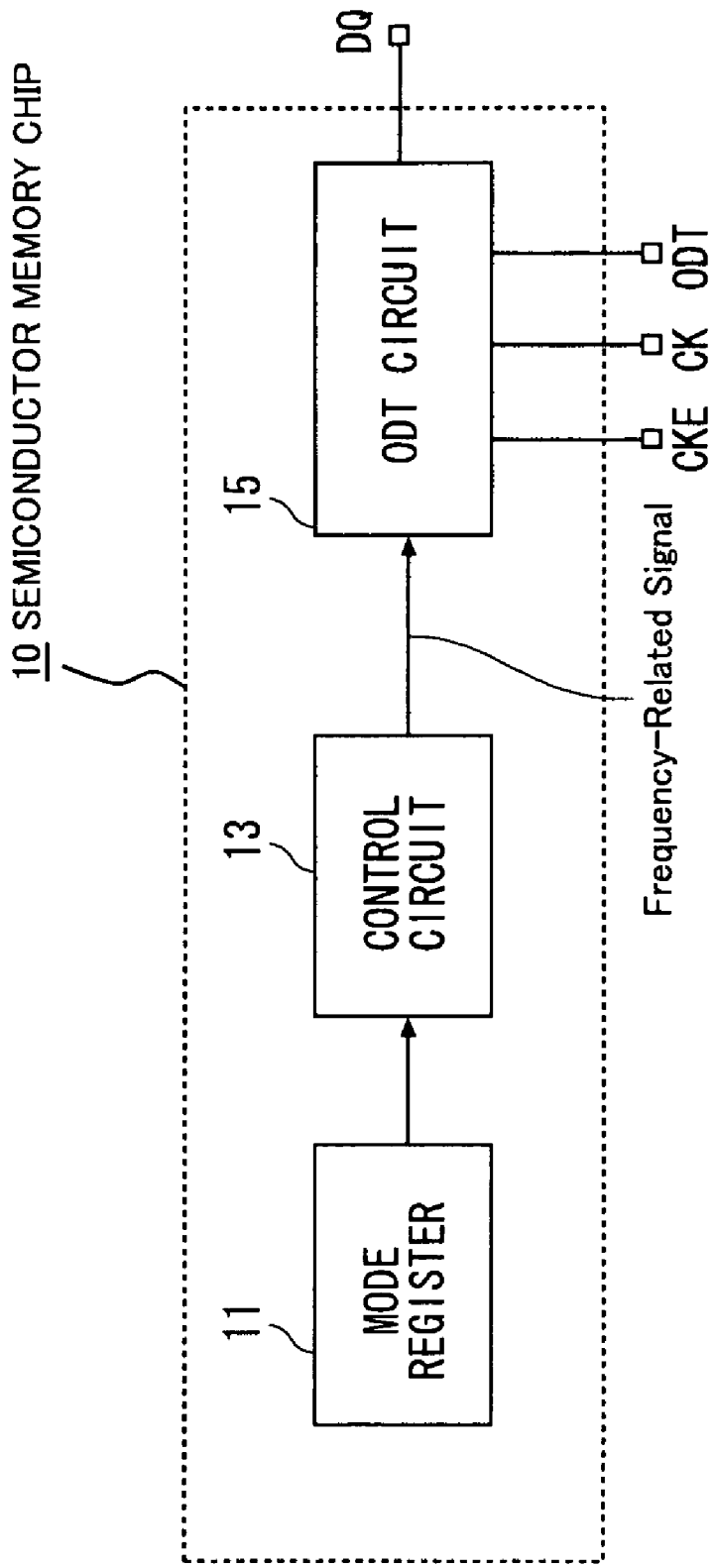
FIG. 1 is a block diagram schematically showing, in part, a semiconductor memory chip according to a first embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

With reference to FIG. 1, a semiconductor memory chip 10 according to a first embodiment of the present invention is a dynamic random access memory (DRAM) chip and comprises a mode register 11, a control circuit 13 and an ODT circuit 15.

The mode register 11 stores a predetermined value associated with a predetermined frequency at which the semiconductor memory chip 10 is used. For example, the semiconductor memory chip 10 of the present embodiment can be used at four different kinds of predefined frequencies, i.e. 400 MHz, 533 MHz, 667 MHZ, 800 MHz. The predetermined frequency is an actually-used one of the predefined frequencies. The mode register may include an extended mode register.

The control circuit 13 produces a frequency-related signal on the basis of the predetermined value stored in the mode register 11. The frequency-related signal implies the predetermined frequency. In other words, the frequency-related signal is for notifying which is the predetermined frequency among the predefined frequency.

The ODT circuit 15 terminates a DQ path in response to an asserted ODT signal. In this embodiment, the termination is carried out by the ODT circuit 15 in consideration of a boost time of a delay locked loop (DLL) circuit included in the ODT circuit 15; the boost time of the DLL circuit is a time required for a stable operation of the DLL circuit after starting and is referred to as a predetermined boost time, hereinbelow.

Figure 2:
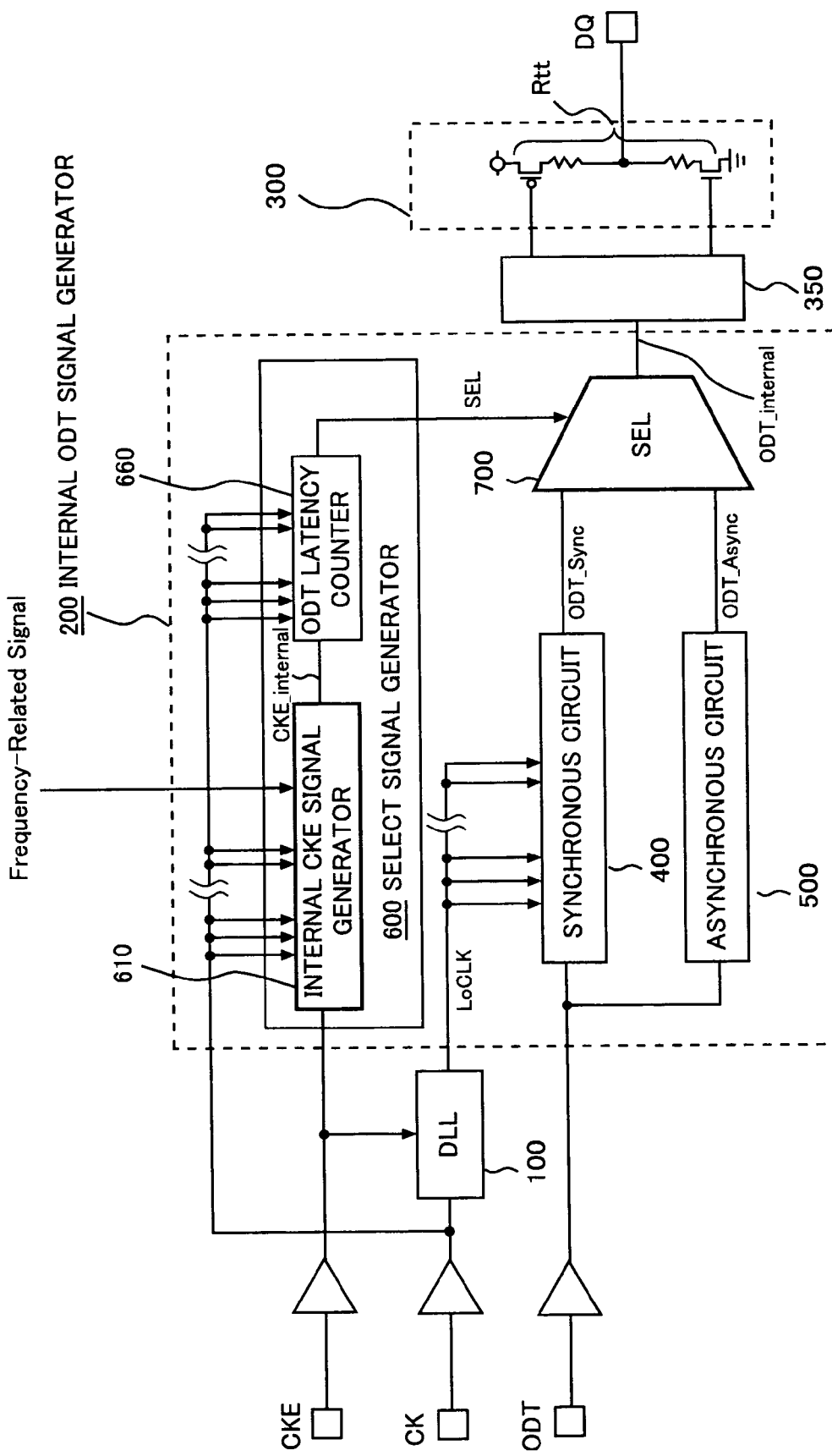
FIG. 2 is a block diagram showing an ODT circuit included in the semiconductor memory chip of FIG. 1.

In detail, as shown in FIG. 2, the ODT circuit 15 comprises a DLL circuit 100, an internal ODT signal generator 200, a pre-buffer 350 and a termination circuit 300. The DLL circuit 100 is configured to produce a local clock signal LoCLK in response to a clock (CK) signal when a CKE signal is asserted. The internal ODT signal generator 200 is configured to produce an internal ODT signal ODT_internal in response to an ODT signal, wherein the internal ODT signal ODT_internal is asynchronous with the local clock signal LoCLK until the DLL circuit 100 becomes stable, while the internal ODT signal is synchronous with the local clock signal LoCLK after the DLL circuit 100 becomes stable. In this embodiment, the termination circuit 300 comprises n-MOS and p-MOS transistors connected to the pre-buffer 350 and resistors connected to the n-MOS and the p-MOS transistors. The DQ path is connected between the resistors and is terminated when the internal ODT signal ODT_internal is asserted. The pre-buffer 350 controls the termination circuit 300 in accordance with the internal ODT signal ODT_internal.

The illustrated internal ODT signal generator 200 according to the present embodiment comprises a synchronous circuit 400, an asynchronous circuit 500, a select signal generator 600, and a selector 700.

The synchronous circuit 400 is configured to delay an ODT signal by a predetermined delay time obtained by using the local clock signal LoCLK. The predetermined delay time corresponds to an ODT latency (ODTL). Namely, the predetermined delay time is equal to a product of the ODT latency and one cycle of the local clock signal LoCLK. The synchronous circuit 400 outputs the delayed ODT signal as a synchronous signal ODT_Sync.

The asynchronous circuit 500 is configured to produce an asynchronous signal ODT_Async in response to the ODT signal.

The select signal generator 600 is configured to assert a select signal SEL in consideration of the predetermined boost time. In detail, the select signal generator 600 asserts the select signal SEL when a predetermined adjustment time is elapsed after the CKE signal is asserted. The predetermined adjustment time is equal to or longer than the predetermined boost time. In this embodiment, the predetermined adjustment time is longer than a sum of the predetermined boost time and an inevitable internal delay at the synchronous circuit 400 but is shorter than another sum of the predetermined boost time, the inevitable internal delay at the synchronous circuit 400 and a switching margin at the selector 700, wherein the inevitable internal delay at the synchronous circuit 400 is shown in FIG. 4 or 5 with a symbol "td4".

The select signal generator 600 according to the present embodiment comprises an internal CKE signal generator 610 and an ODT latency counter 660.

Figure 4:
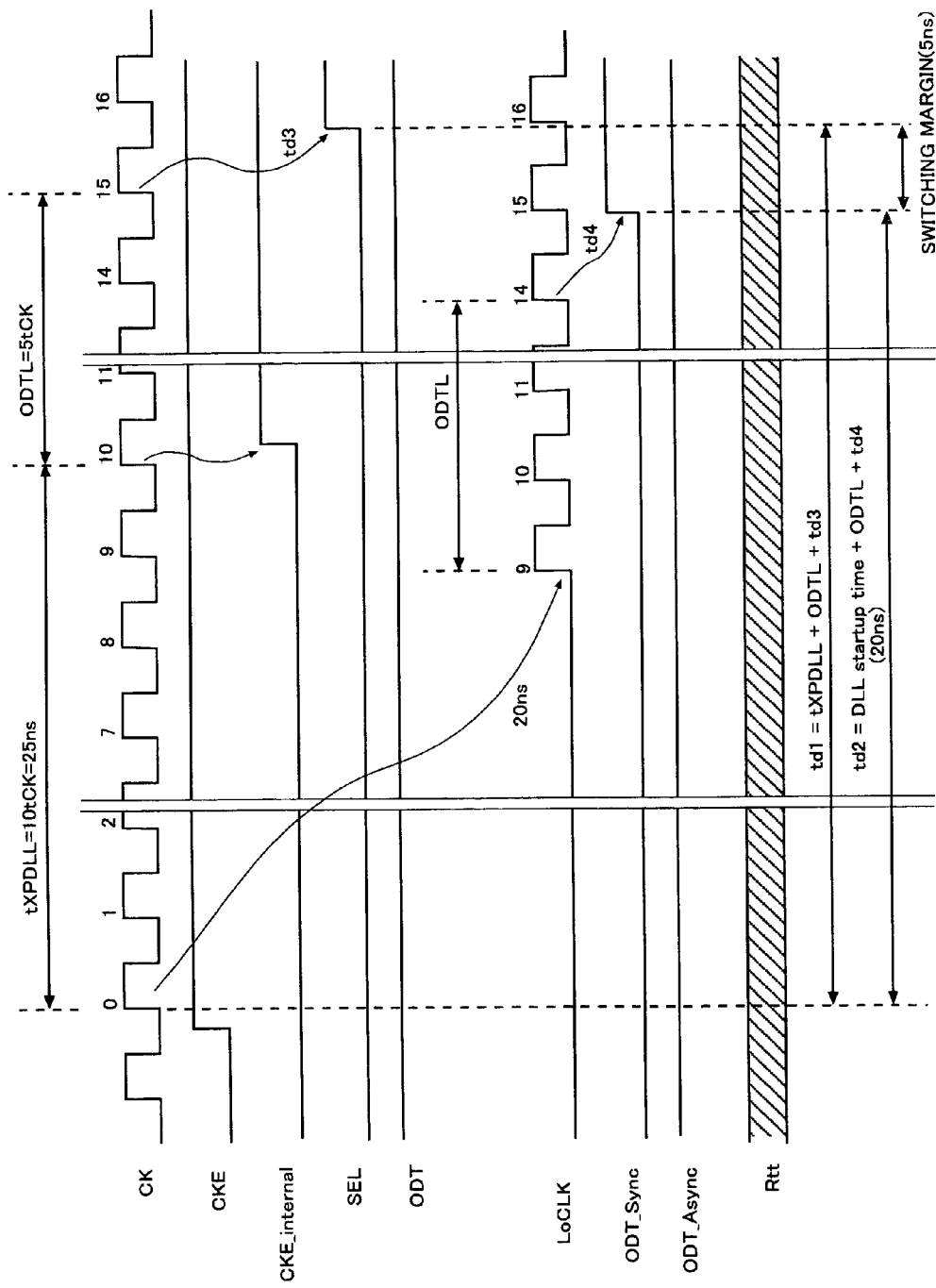
FIG. 4 is a timing chart showing signal relations in the semiconductor memory chip of FIG. 1 under a condition that the semiconductor memory chip is used at 400 MHz.
Figure 5:
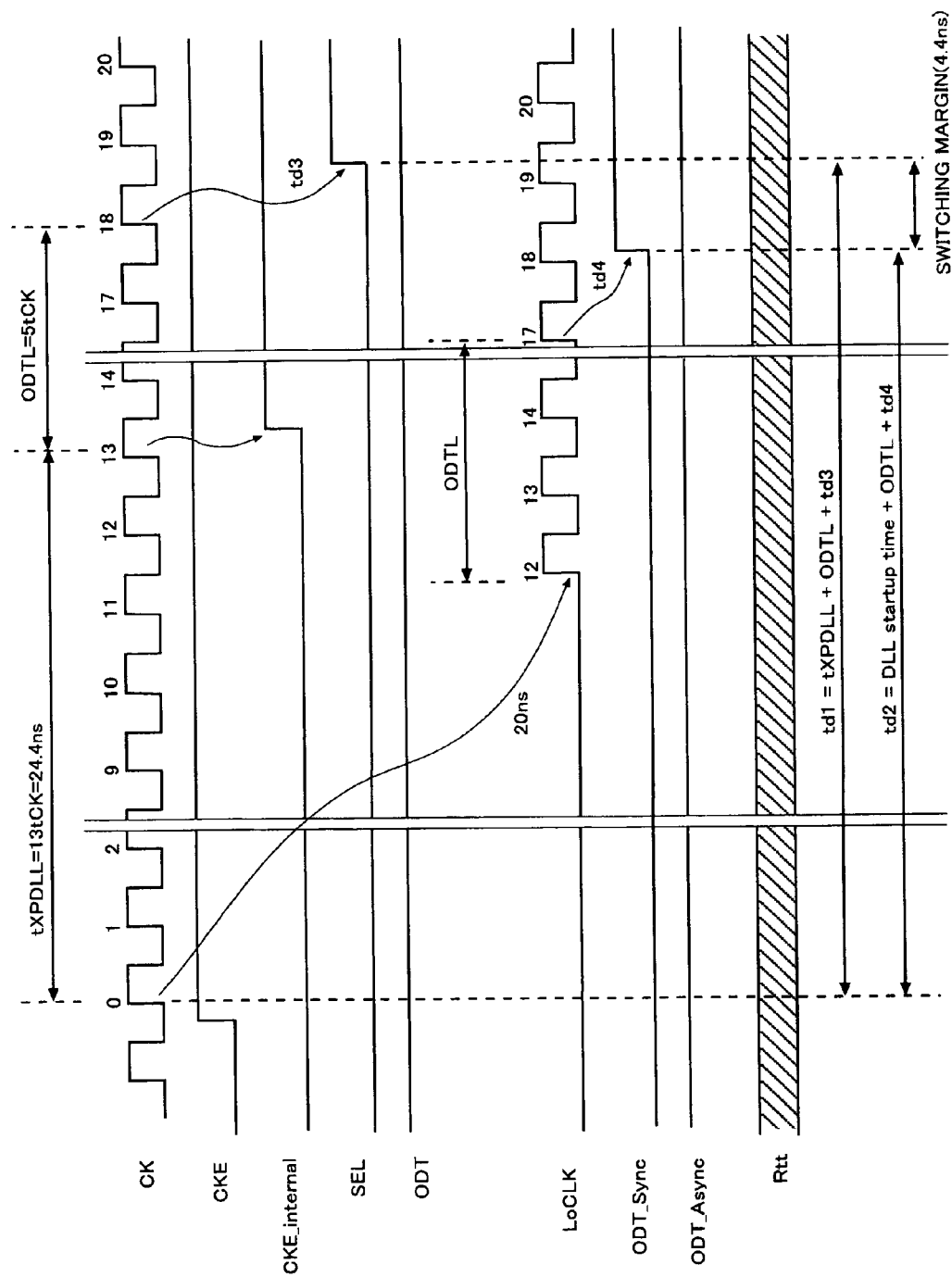
FIG. 5 is another timing chart showing signal relations in the semiconductor memory chip of FIG. 1 under another condition that the semiconductor memory chip is used at 533 MHz.

The internal CKE signal generator 610 is configured to delay the CKE signal by a predetermined CKE delay time, which is shown in FIG. 4 or 5 with a symbol tXPDLL. The internal CKE signal generator 610 outputs the delayed CKE signal as an internal CKE signal CKE_internal into the ODT latency counter 660.

In this embodiment, the internal CKE signal generator 610 carries out the delay process for the CKE signal on the basis of the predetermined CKE delay time tXPDLL obtained by using the CK signal. The illustrated internal CKE signal generator 610 receives the frequency-related signal from the control circuit 13, which is shown in FIG. 1, and calculates the predetermined CKE delay time tXPDLL by using the CK signal and the frequency-related signal.

Figure 3:
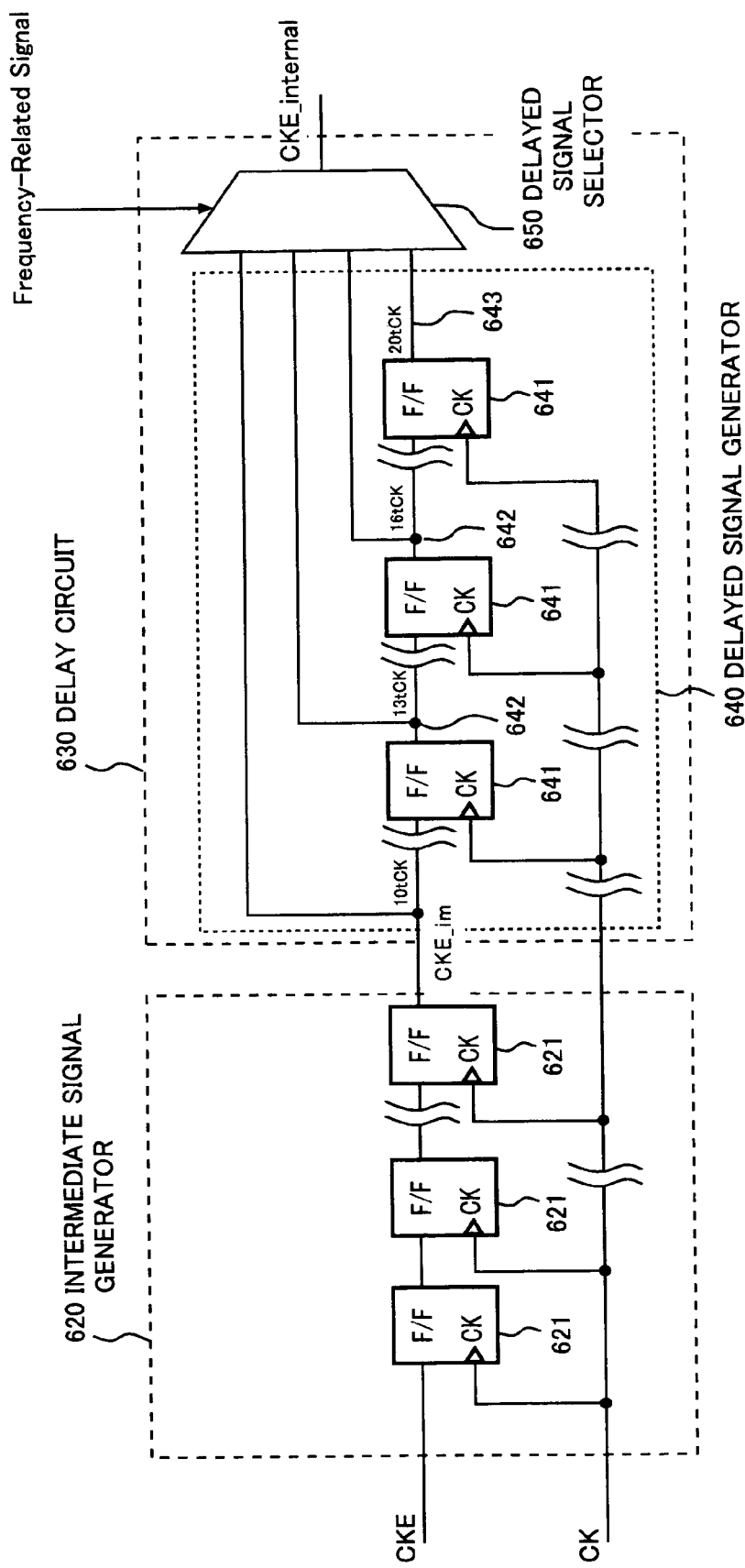
FIG. 3 is a block diagram showing an internal clock enable (internal CKE) signal generator included in the ODT circuit of FIG. 2.

Further in detail, as shown in FIG. 3, the internal CKE signal generator 610 comprises an intermediate signal generator 620 and a delay circuit 630.

The intermediate signal generator 620 is configured to latch the CKE signal for a first period to output the latched CKE signal as an intermediate signal CKE_im. The illustrated intermediate signal generator 620 comprises a shift register consisting of a plurality of flip-flops 621 connected in series and operative at cycles of the clock signal; the first period is equal to a product of one cycle of the CK signal and the number of the flip-flops 621. In this embodiment, the number of the flip-flops 621 is selected so that the intermediate signal CKE_im is output as the internal CKE signal CKE_internal from the delay circuit 630 in the case where the predetermined frequency is a lowest frequency among the predefined frequencies.

The delay circuit 630 is configured to delay the intermediate signal CKE_im by a second period to output the delayed intermediate signal as the internal CKE signal CKE_internal into the ODT latency counter 660. In this embodiment, the second period is selectable among a plurality of delay period including zero nanosecond (0 ns) in accordance with the frequency-related signal.

The illustrated delay circuit 630 comprises a delayed signal generator 640 and a delayed signal selector 650. The delayed signal generator 640 is configured to delay the intermediate signal CKE_im by a plurality of delay periods to produce a plurality of delayed signals; the delay periods are different from each other and correspond to the predefined frequencies, respectively. In this embodiment, the delayed signal generator 640 comprises a plurality of flip-flops 641 connected in series and a plurality of taps 642. Each tap 642 is connected to one of output portions of the flip-flops 641. Because the semiconductor memory chip 10 of the present embodiment can be used at four different kinds of predefined frequencies, i.e. 400 MHz, 533 MHz, 667 MHZ, 800 MHz, the number of the slip-flops 641 is at least three, and the number of taps 642 is at least two. The taps 642 and the output portion 643 of the last stage of the flip-flops 641 output the delayed signals, respectively. The delayed signals are input into the delayed signal selector 650. In this embodiment, the intermediate signal CKE_im is also input as another delayed signal into the delayed signal selector 650. The delayed signal selector 650 is configured to select one of the delayed signals in accordance with the frequency-related signal. The selected delayed signal is output as the internal CKE signal CKE_internal from the delayed signal selector 650 to the ODT latency counter 660.

Turning back to FIG. 2, the ODT latency counter 660 is configured to latch the internal CKE signal CKE_internal for the predetermined delay time by counting cycles of the clock signal by the ODT latency. The ODT latency counter 660 outputs the latched internal CKE signal as the select signal SEL into the selector 700. In other words, the select signal SEL is asserted when at least a sum of the predetermined CKE delay time tXPDLL and the ODT latency is elapsed after the CKE signal is asserted.

The selector 700 is configured to select the asynchronous signal ODT_Async until the select signal SEL is asserted and to select the synchronous signal ODT_Sync after the select signal SEL is asserted.

FIG. 4 shows an example where the semiconductor memory chip is used at 400 MHz, i.e. one clock cycle (tCK) is 2.5 ns. The predetermined boost time is 20 ns, and the ODT latency is 5 clock cycles (5 tCK). In this example, the predetermined CKE delay time tXPDLL is selected as 10 clock cycles (10 tCK), i.e. 25 ns, in consideration of the predetermined boost time, 20 ns, and the switching margin at 400 MHz, 5 ns. Thus, when the selected signal SEL is asserted, the synchronous signal ODT_Sync follows the ODT signal so that there is no malfunction.

The predetermined boost time is substantially constant irrespective of the operation frequency of the semiconductor memory chip, e.g. 20 ns in the shown example. On the other hand, clock cycle (tCK) varies dependently upon the operation frequency. For example, if the operation frequency is 533 MHz, one clock cycle (tCK) is 1.876 ns; 10 clock cycles (10 tCK), 18.76 ns, is smaller than the predetermined boost time, 20 ns. In this embodiment, the predetermined CKE delay time tXPDLL is 13 clock cycles (13 tCK), 24.4 ns at 533 MHz, as shown in FIG. 5. Thus, the semiconductor memory chip can operate without malfunction even when its operation frequency is changed.

As in the present embodiment, the predefined frequencies, i.e. 400 MHz, 533 MHz, 667 MHZ, 800 MHz, preferably correspond to conceivable contents of the frequency-related signal or the predetermined value stored in the mode register 11 in order to obtain suitable switching operation at the selector 700 without malfunction. However, the present invention allows some modifications in consideration of required accuracy and/or an allowable time margin for outputting the internal ODT signal ODT_internal. For example, if the predetermined value stored in the mode register 11 indicates possible two or more frequencies, the control circuit 13 may produce the frequency-related signal in consideration of the highest frequency of the possible frequencies. In this case, the switching margin at the selector 700 may be determined in consideration of the lowest frequency of the possible frequencies.

Next explanation will be made about a semiconductor memory chip according to a second embodiment of the present invention. The second embodiment is a modification of the first embodiment and is similar to the first embodiment. The second embodiment is different from the first embodiment in the structure of the delay circuit included in the internal CKE signal generator 610, especially, the structure of the delayed signal generator.

Figure 6:
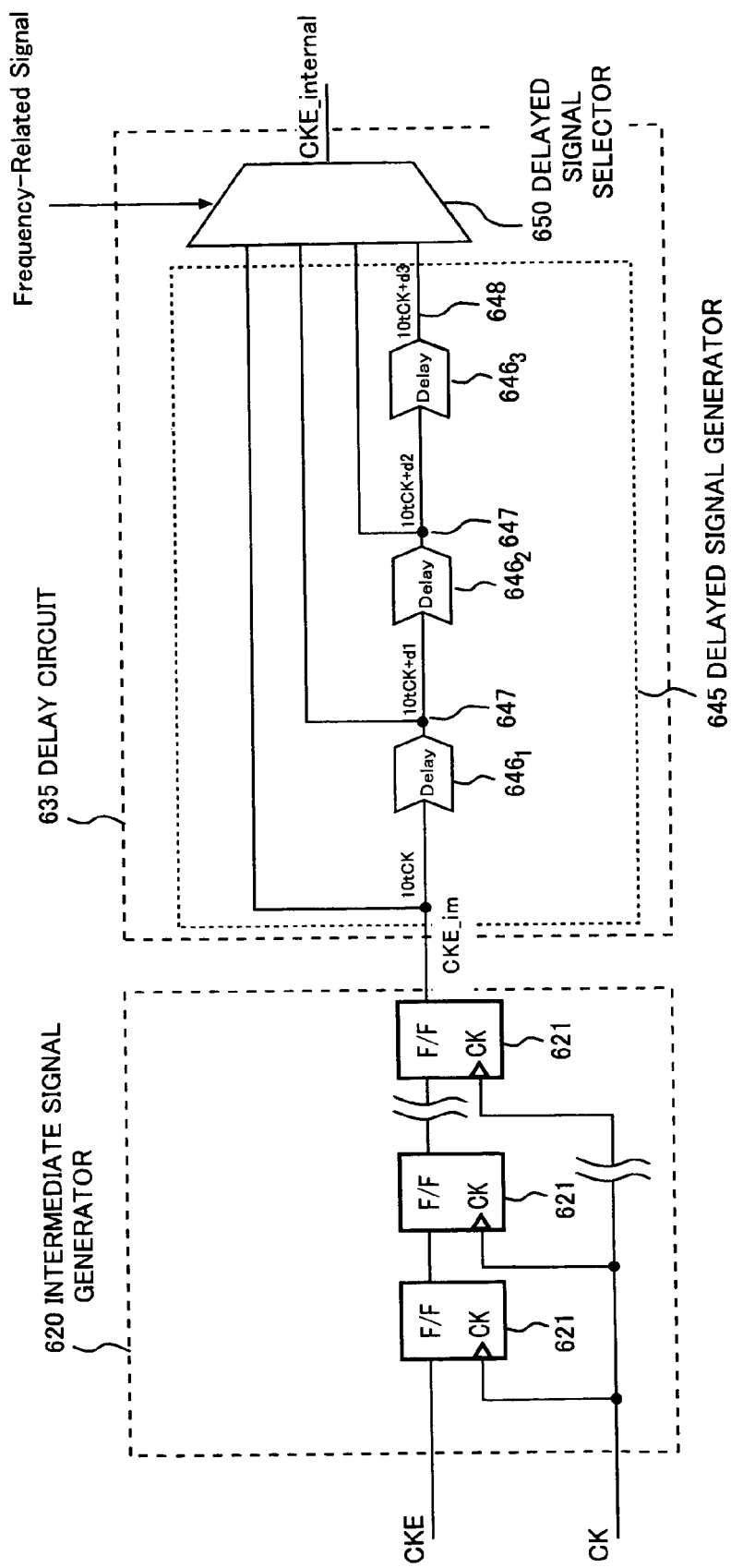
FIG. 6 is a block diagram schematically showing another internal CKE signal generator included in a semiconductor memory chip according to a second embodiment of the present invention.

With reference to FIG. 6, the delayed signal generator 645 included in the delay circuit 635 according to the second embodiment comprises a plurality of delay elements $646_1$ to $646_3$ connected in series and a plurality of taps 647. Each tap 647 is connected to one of output portions of the delay elements $646_1$ and $646_2$. The delay elements $646_1$, $646_2$, $646_3$ provide delay periods d1, d2−d1, and d3−(d1+d2), respectively. The taps 647 and the output portion 648 of the last stage of the delay element $646_3$ output the delayed signals 10 tCK+d1, 10 tCK+d2, and 10 tCK+d3, respectively. The differences d1, d2, d3 relative to 10 tCK are determined in consideration of the operation frequency of 533 MHz, 667 MHz and 800 MHz, respectively.

Although the frequency-related signal is produced on the basis of the predetermined value stored in the mode register 11 in the above-described embodiments, the frequency-related signal may be directly supplied from the outside of the semiconductor memory chip or may be produced inside of the semiconductor memory chip by interpreting or assuming command signals and so on; in the former case, it is required that the semiconductor memory chip has a terminal only for receiving the frequency-related signal from outside.

While there has been described what is believed to be the preferred embodiment of the invention, those skilled in the art will recognize that other and further modifications may be made thereto without departing from the sprit of the invention, and it is intended to claim all such embodiments that fall within the true scope of the invention.

What is claimed is:

1. A semiconductor memory chip comprising:
a delay locked loop (DLL) circuit configured to produce a local clock signal in response to a clock signal when a clock enable (CKE) signal is asserted, the DLL circuit having a predetermined boost time;
a synchronous circuit configured to delay an input signal by a predetermined delay time obtained by using the local clock signal, the synchronous circuit outputting the delayed input signal as a synchronous signal;
an asynchronous circuit configured to produce an asynchronous signal in response to the input signal;
a select signal generator configured to assert a select signal when a predetermined adjustment time is elapsed after the CKE signal is asserted, the predetermined adjustment time being equal to or longer than the predetermined boost time; and
a selector configured to select the asynchronous signal until the select signal is asserted and to select the synchronous signal after the select signal is asserted.

2. The semiconductor memory chip according to claim 1, wherein the select signal generator carries out the assertion process on the basis of the predetermined adjustment time obtained by using the clock signal.

3. The semiconductor memory chip according to claim 2, the semiconductor memory chip being operable at a plurality of predefined frequencies, wherein the select signal generator calculates the predetermined adjustment time by using the clock signal and a frequency-related signal notifying a predetermined frequency which is an actually-used frequency among the predefined frequency.

4. The semiconductor memory chip according to claim 3, further comprising:
a mode register adapted to store a predetermined value associated with the predetermined frequency; and
a control circuit adapted to produce the frequency-related signal based on the predetermined value.

5. A semiconductor memory chip comprising:
a delay locked loop (DLL) circuit configured to produce a local clock signal in response to a clock signal when a clock enable (CKE) signal is asserted, the DLL circuit having a predetermined boost time;
a synchronous circuit configured to delay an input signal by a predetermined delay time obtained by using the local clock signal, the synchronous circuit outputting the delayed input signal as a synchronous signal;
an asynchronous circuit configured to produce an asynchronous signal in response to the input signal;
a select signal generator configured to assert a select signal when a predetermined adjustment time is elapsed after the CKE signal is asserted, the predetermined adjustment time being equal to or longer than the predetermined boost time; and
a selector configured to select the asynchronous signal until the select signal is asserted and to select the synchronous signal after the select signal is asserted,
the input signal being an On-Die Termination (ODT) signal, the selector selecting one of the synchronous signal and the asynchronous signal as an internal ODT signal, the semiconductor memory chip further comprising a signal line and a termination circuit, the termination circuit being configured to terminate the signal line in response to the internal ODT signal.

6. The semiconductor memory chip according to claim 5, each of the local clock signal and the clock signal consisting of multiple cycles, wherein:
the predetermined delay time corresponds to an ODT latency; and
the synchronous circuit is configured to count cycles of the local clock signal by the ODT latency upon receipt of the ODT signal to produce the synchronous signal, the predetermined delay time being equal to a product of the ODT latency and one cycle of the local clock signal.

7. The semiconductor memory chip according to claim 6, wherein the select signal generator comprises:
an internal CKE signal generator configured to delay the CKE signal by a predetermined CKE delay time, the internal CKE signal generator outputting the delayed CKE signal as an internal CKE signal; and
an ODT latency counter configured to latch the internal CKE signal for the predetermined delay time by counting cycles of the clock signal by the ODT latency, the ODT latency counter outputting the latched internal CKE signal as the select signal into the selector.

8. The semiconductor memory chip according to claim 7, the semiconductor memory chip being used at a predetermined frequency, wherein the internal CKE signal generator comprises:

an intermediate signal generator configured to latch the CKE signal for a first period, the intermediate signal generator outputting the latched CKE signal as an intermediate signal; and a delay circuit configured to delay the intermediate signal by a second period, the delay circuit outputting the delayed intermediate signal as the internal CKE signal into the ODT latency counter.

9. The semiconductor memory chip according to claim 8, being operable at a plurality of predefined frequencies, wherein the delay circuit comprises:

a delayed signal generator configured to delay the intermediate signal by a plurality of delay periods to produce a plurality of delayed signals, the delay periods being different from each other and corresponding to the predefined frequencies, respectively; and a delayed signal selector configured to select one of the delayed signals in accordance with a frequency-related signal indicative of a frequency estimated as the predetermined frequency.

10. The semiconductor memory chip according to claim 9, wherein the delayed signal generator comprises a plurality of flip-flops connected in series and one or more taps, each of the flip-flops being provided with an output portion, each of the taps being connected to one of the output portions, a last stage of the connected flip-flops and the taps outputting the delayed signals, respectively.

11. The semiconductor memory chip according to claim 10, the predefined frequencies being four or more different kinds of frequencies, wherein the flip-flops are three or more in number, while the taps are two or more in number.

12. The semiconductor memory chip according to claim 9, wherein the delayed signal generator comprises a plurality of delay elements connected in series and one or more taps, each of the delay elements being provided with an output portion, each of the taps being connected to one of the output portions, a last stage of the connected delay elements and the taps outputting the delayed signals, respectively.

13. The semiconductor memory chip according to claim 12, the predefined frequencies being four or more different kinds of frequencies, wherein the delay elements are three or more in number, while the taps are two or more in number.

14. The semiconductor memory chip according to claim 9, wherein the intermediate signal generator comprises a shift register consisting of a predetermined number of flip-flops connected in series and operative at cycles of the clock signal, the first period being equal to a product of the predetermined number and one cycle of the clock signal.

15. The semiconductor memory chip according to claim 14, wherein the predetermined number is selected so that the intermediate signal is output as the internal CKE signal from the delay circuit in a case where the predetermined frequency is a lowest frequency among the predefined frequencies.

16. The semiconductor memory chip according to claim 9, further comprising:

a mode register adapted to store a predetermined value associated with the predetermined frequency; and a control circuit adapted to produce the frequency-related signal based on the predetermined value.

17. A semiconductor memory chip comprising:

a delay locked loop (DLL) circuit configured to produce a local clock signal in response to a clock signal when a clock enable (CKE) signal is asserted, the DLL circuit having a predetermined boost time;

a synchronous circuit configured to produce a synchronous signal which is synchronous with the local clock signal;

an asynchronous circuit configured to produce an asynchronous signal;

a select signal generator configured to assert a select signal in consideration of the predetermined boost time; and a selector configured to select the asynchronous signal until the select signal is asserted and to select the synchronous signal after the select signal is asserted.

18. A semiconductor memory chip as claimed in claim 17, wherein the input signal is an On-Die Termination (ODT) signal.

* * * * *